United States Patent [19]
Aoki et al.

[11] Patent Number: 5,572,616
[45] Date of Patent: Nov. 5, 1996

[54] WAVEGUIDE DEVICE

[75] Inventors: Masahiro Aoki, Kokubunji; Tatemi Ido, Hachioji; Takayuki Tsutsui, Komoro; Kazuhisa Uomi, Hachioji; Tomonobu Tsuchiya, Kodaira; Makoto Okai, Tokorozawa; Atsushi Nakamura, Komoro, all of Japan

[73] Assignee: Hitachi, Ltd., Tokyo, Japan

[21] Appl. No.: 380,571

[22] Filed: Jan. 30, 1995

[30] Foreign Application Priority Data

Jan. 31, 1994 [JP] Japan .................................. 6-009116
Mar. 10, 1994 [JP] Japan .................................. 6-039442

[51] Int. Cl.⁶ ................................................. G02B 6/10
[52] U.S. Cl. ........................ 385/131; 385/141; 385/146; 385/132
[58] Field of Search .................................. 385/13.1, 130, 385/119, 141, 146, 14, 132; 372/46, 45

[56] References Cited

U.S. PATENT DOCUMENTS

| | | | |
|---|---|---|---|
| 5,161,166 | 11/1992 | Shima et al. | 372/46 |
| 5,161,167 | 11/1992 | Murakami et al. | 372/46 |
| 5,177,757 | 1/1993 | Tsugami | 372/45 |
| 5,210,767 | 5/1993 | Arimoto et al. | 372/46 |

OTHER PUBLICATIONS

Matsumoto et al., "High Reliability 1.3μm Ridge Waveguide MQW Lasers", Institute of Electronics, Information and Communication Engineers of Japan, '93 Spring Conference C–159, Mar. 1993.

Primary Examiner—John Ngo
Attorney, Agent, or Firm—Antonelli, Terry, Stout & Kraus

[57] ABSTRACT

A waveguide device includes an indium phosphide substrate, an active layer formed on the indium phosphide substrate, and a cladding layer formed on the active layer, the cladding layer having a ridge structure the side wall of which is configured into a reversed mesa form.

15 Claims, 7 Drawing Sheets

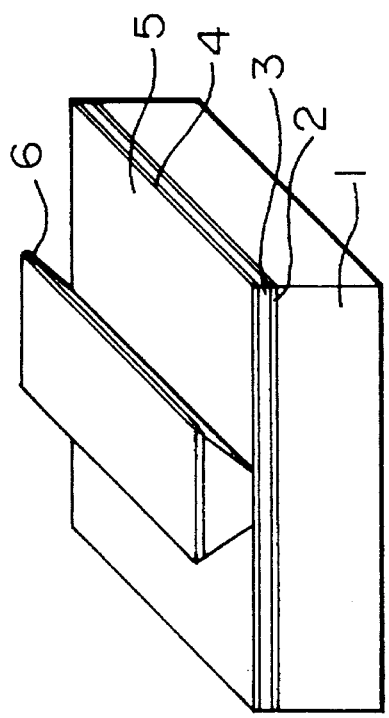
FIG. IA
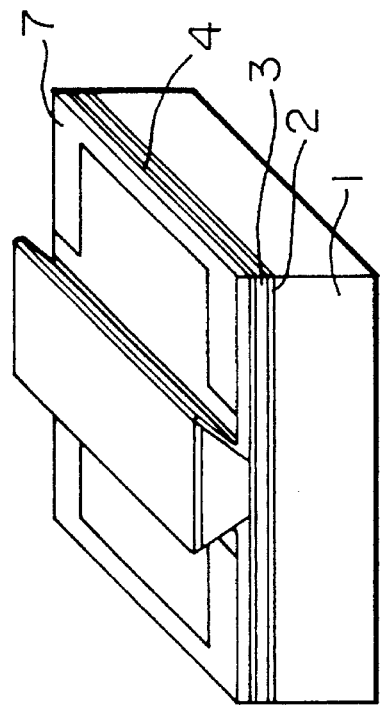
FIG. IB
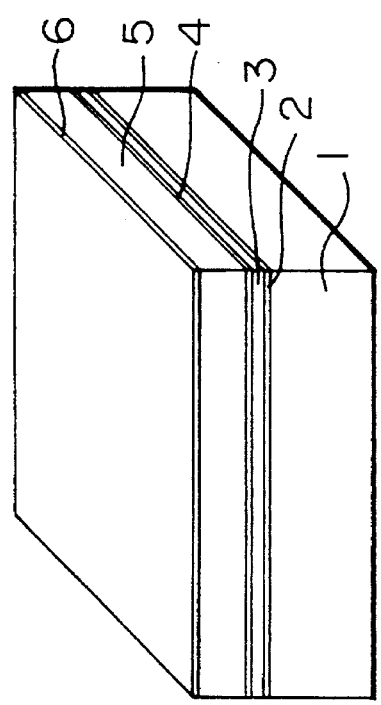
FIG. IC
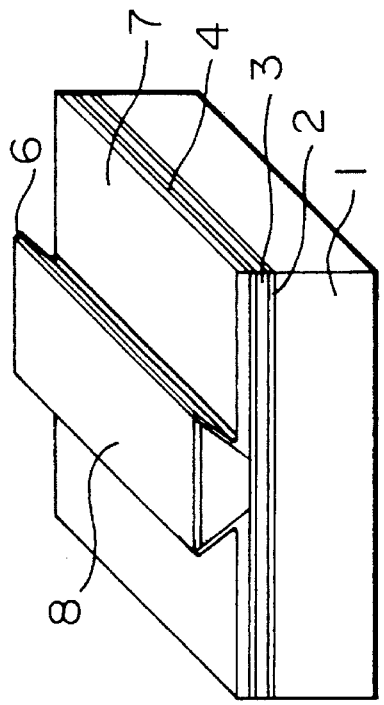
FIG. ID

WAVEGUIDE DEVICE

BACKGROUND OF THE INVENTION

The present invention relates to an optical semiconductor device, and more particularly to an optical semiconductor device suitable for use in an optical communication module, optical communication system or optical network.

One crystal growth step suffices for the fabrication of a ridge-waveguide device. Therefore, the fabrication process of the ridge-waveguide device is very simple as compared with that of a buried-hetero-structure device. Hitherto, a satisfactory device reliability has been reported about an indium phosphide-based ridge waveguide lasers. However, the conventional indium phosphide ridge lasers using a ridge (denoted by reference numeral 70 in FIG. 9) with a rectangular cross section formed by use of a wet etching technique with hydrochloric acid involves the following problems.

(1) Since the width of an electrode contact on an active layer and the width of a light emitting layer of the active layer are substantially the same, it is required from the aspect of reduction in resistance of the device that the width of the cross section of the ridge providing the width of a light emitting region should be set to a value equal to or larger than 2 μm. Therefore, it is difficult to realize the stabilization of a transverse mode and the reduction of the threshold current to a value not larger than 10 mA. Further, since the device resistance is relatively large, a high-output operation is limited due to a thermal saturation phenomenon.

(2) Since it is difficult to make the width of the light emitting region narrow, it is difficult to reduce a parasitic capacitance of the device.

(3) A lithographic alignment precision required in providing an insulating layer window for an electrode contact on the ridge is very severe.

Techniques relevant to the ridge waveguide lasers have been disclosed by Institute of Electronics, Information and Communication Engineers of Japan, '93 Spring Conference C-159, March 1993.

SUMMARY OF THE INVENTION

An object of the present invention is provide the device structure of an indium phosphide-based ridge waveguide laser which is realizable by a very simple fabrication method and is capable of a high-output and high-speed operation with a low threshold current and to provide a method of fabricating such a device structure. Another object of the present invention is to provide a device structure suitable for application to an indium phosphide laser, optical amplifier, optical modulator, optical switch, optical detector or integrated waveguide device in which at least two of the mentioned devices are integrated and to provide a method of fabricating such a device structure.

To that end, the present inventors have proposed a waveguide structure in which a greatly improved device characteristic is obtained by configuring the side wall of an indium phosphide ridge waveguide into a reversed mesa form to make the width of an electrode contact large and hence a light emitting region narrow and have proposed a method of fabricating such a waveguide structure.

Explanation will now be made of such a waveguide structure and the fabrication method thereof.

As shown in FIG. 1A, an active layer 2 of InGaAsP having a thickness of 0.1 μm (and a composition wavelength of 1.30 μm, a spacer layer 3 of p-type InP having a thickness of 0.1 μm, an etching stopper layer 4 of InGaAsP having a thickness of 10 nm thickness (and a composition wavelength of 1.10 μm), a cladding layer 5 of p-type InP having a thickness of 2.0 μm and a cap layer 6 of p-type InGaAs having a thickness of 0.2 μm are successively formed on a semiconductor substrate 1 of n-type (100) InP by use of known techniques.

Next, the cap layer 6 is worked into a stripe structure of 4.4 μm width by use of a known technique. The direction of the stripe is [011]. Subsequently, wet etching with a hydrobromic acid solution or a mixture solution of hydro-bromic acid and phosphoric acid is conducted to form a ridge waveguide which has a reversed mesa form as showing in FIG. 1B. Thereby, a (111) A surface having the latest speed of etching by the above etching solution is naturally formed at the side wall of the ridge. As a result, the width of a constriction of the mesa providing the width of a light emitting region can be made narrow or reduced to 1.5 μm with the width of an electrode contact being kept wide or 4.4 μm.

Next, a silicon oxide film 7 of 0.5 μm thickness as shown in FIG. 1C is formed on the entire surface of the substrate by use of a known technique. Thereafter, an window 8 of 3.4 μm width passing through the silicon oxide film is formed on the upper surface of the ridge by use of an ordinary lithographic and etching process. In this case, since the width of the upper surface of the ridge is sufficiently large or 4.4 μm, the lithographic alignment precision is greatly moderated to about 0.5 μm as compared with that required in the window forming step of the conventional structure shown in FIG. 9. Also, even in the case where a so-called photoresist etch-back method is used in the window forming step, the silicon oxide film on the side wall of the ridge of the reversed mesa structure in the present invention is not exposed even in the case where the etch-back amount becomes large. Therefore, the reliability of the window forming step is greatly improved.

After an electrode forming step, a device having a resonator or cavity length of 300 μm is cut through a cleavage process. A high-reflection film having a reflectivity of 70% is applied on one end face of the device. FIG. 1D shows the form of the cross section of the completed device. The fabricated device exhibits a satisfactory characteristic including a threshold current of 8 to 10 mA and a slope efficiency of 0.40 W/A under a room temperature and continuous operating condition. Also, the forward resistance of the device is about 2 ohms or can be reduced to about one half to two thirds of that of the conventional device shown in FIG. 9. The frequency band of the fabricated device is equal to or larger than 20 GHz as the result of reflection of the reduction of the device resistance and the narrowing of the light emitting region width to 1.5 μm. A device of 900 μm length including grown layers on the lower side thereof attains a high-output operation of 200 mW at the maximum.

As mentioned above, with the configuration of the side wall of the ridge of the ridge waveguide laser into the reversed mesa form, not only the reduction in threshold current, the increase in efficiency and the increase in output can easily be realized but also the high-speed frequency band width of the device can be expanded.

It is needless to say that a similar effect is also obtained in the case where the above-mentioned principle of the present invention is applied to an optical amplifier, an optical modulator, an optical switch, an optical detector or an integrated waveguide device in which at least two of the mentioned devices are integrated.

BRIEF DESCRIPTION OF THE DRAWINGS

FIGS. 1A to 1D are perspective views showing an embodiment of a waveguide device of the present invention;

DESCRIPTION OF THE PREFERRED EMBODIMENTS

Embodiments of the present invention will now be described by use of the accompanying drawings.

(Embodiment 1)

Figure 2A:
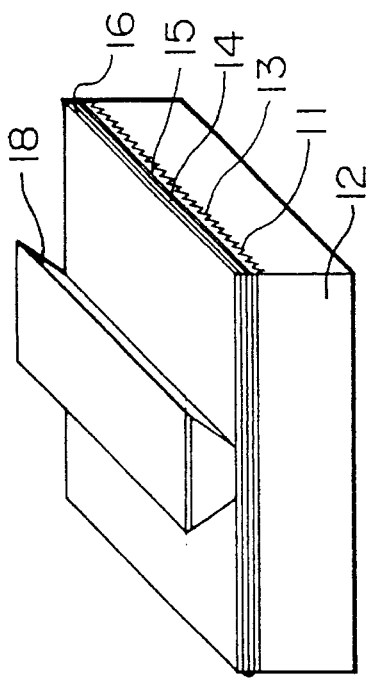
FIGS. 2A to 2D are perspective views showing the structure of one embodiment of the waveguide device of the present invention.

As shown in FIG. 2A, a lower light guiding layer 13 of InGaAsP having a thickness of 0.15 μm (and a composition wavelength of 1.10 μm), a 7-period multiple quantum well (MQW) structure composed of a well layer 14 of InGaAsP having a thickness of 6.0 nm (and a composition wavelength of 1.37 μm) and a barrier layer 15 of InGaAsP having a thickness of 8 nm (and a composition wavelength of 1.10 μm), an upper light guiding layer 16 of InGaAsP having a thickness of 0.05 μm (and a composition wavelength of 1.10 μm), a cladding layer 17 of p-type InP having a thickness of 2.0 μm and a cap layer 18 of p-type InGaAs having a thickness of 0.2 μm are successively formed, through known techniques, on a semiconductor substrate 12 of n-type (100) InP having a diffraction grating 11 thereon.

Figure 2B:
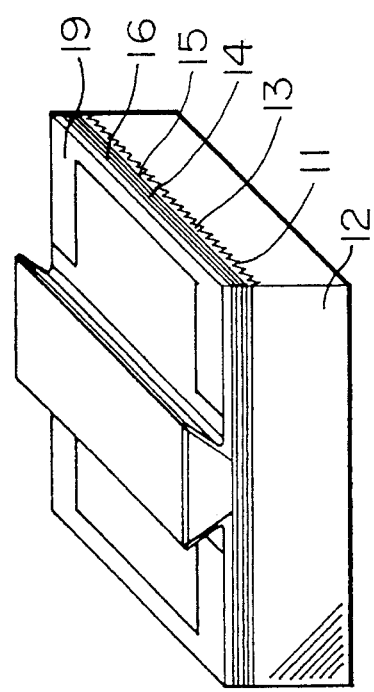

Next, the cap layer 18 is worked into a stripe structure of 4.4 μm width by use of a known technique. The direction of the stride is [011]. Subsequently, wet etching with a mixture solution of hydro-bromic acid and phosphoric acid is conducted to form a ridge waveguide, as shown in FIG. 2B, which has a (111) A surface as the side wall of the ridge and has a reversed mesa form in cross section.

Figure 2C:
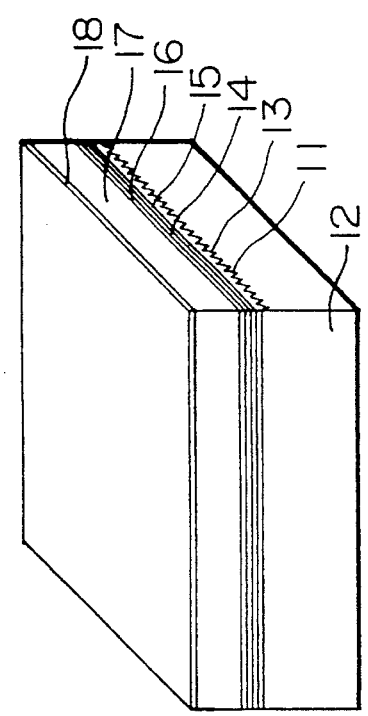
Figure 2D:
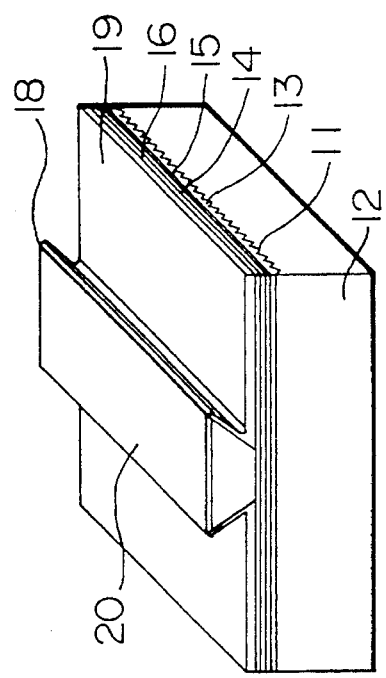

Next, a silicon oxide film 19 of 0.15 μm thickness as shown in FIG. 2C is formed on the entire surface of the substrate by use of a known technique. Thereafter, an window 20 passing through the silicon oxide film is formed on the upper surface of the ridge by use of an etch-back method. After an electrode forming step, a device having a cavity length of 300 μm is cut through a cleavage process. A low-reflection film having a reflectivity of about 1% and a high-reflection film having a reflectivity of 90% are respectively formed on front and rear end faces of the device by use of known techniques. FIG. 2D shows the form of the cross section of the completed device.

The fabricated device exhibited a satisfactory oscillation characteristic including a threshold current of 6 to 9 mA and a slope efficiency of 0.45 W/A under a room temperature and continuous operating condition. The characteristic under a high temperature condition of 85° C. was also satisfactory or exhibited a threshold current of 20 to 25 mA and a slope efficiency of 0.30 W/A. Also, the evaluation of the device as to the longterm reliability demonstrated a stable operation over ten thousand hours under a high temperature condition of 100° C.

(Embodiment 2)

Figure 3A:
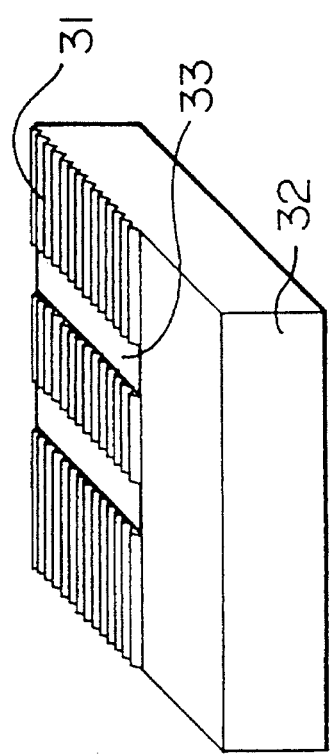
FIGS. 3A to 3D are perspective views showing the structure of another embodiment of the waveguide device of the present invention.
Figure 3B:
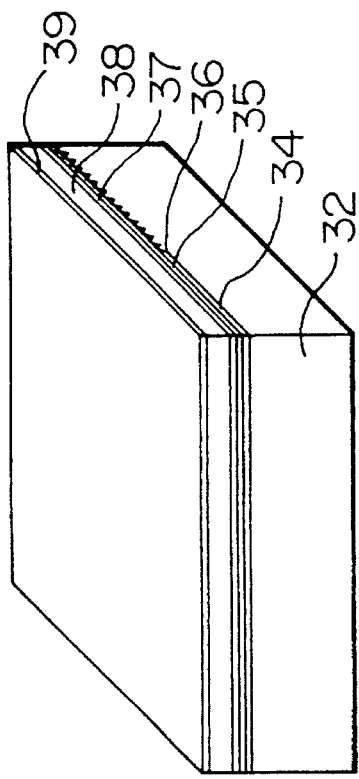

Referring to FIG. 3A, a diffraction grating 31 having a fixed period of 240.5 nm is formed on a part of a substrate 32 of n-type (100) InP. An $SiO_2$ mask 33 is formed, through a known technique, on a portion of the region of the substrate 32 where the diffraction grating 31 is formed. The mask 33 includes two stripes each of which has a width of 18 μm and which have an interval of 16 μm therebetween. Next, a reduced-pressure organic metal vapor phase growth method is used to form a lower light guiding layer 34 of InGaAsP having a thickness of 0.15 μm (and a composition wavelength of 1.15 μm) and a 7-period MQW structure composed of a well layer 35 of InGaAs having a thickness of 6.5 nm and a lattice constant shorter than that of InP by 0.3% and a barrier layer 36 of InGaAsP having a thickness of 8 nm (and a composition wavelength of 1.15 μm), as shown in FIG. 3B. After the SiO mask 33 is removed by use of a known technique, there are grown an upper light guiding layer 37 of InGaAsP having a thickness of 0.03 μm (and a composition wavelength of 1.15 μm), a cladding layer 38 of p-type InP having a thickness of 2.0 μm and a cap layer 39 of p-type InGaAs having a thickness of 0.2 μm.

Figure 3C:
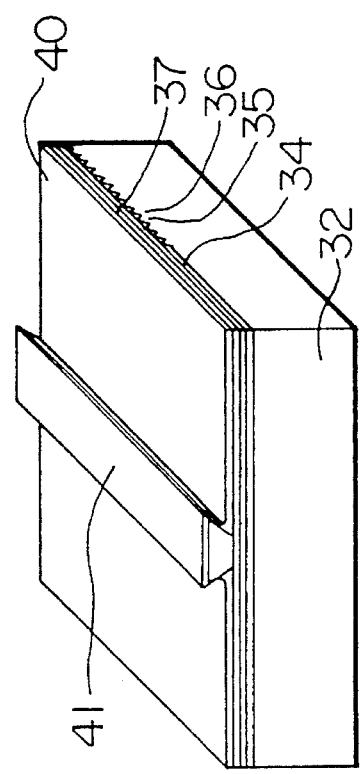

Next, as shown in FIG. 3C, the cap layer 39 is worked into a stripe structure of 4.4 μm width by use of a known technique, in a manner similar to that in the Embodiment 1. The direction of the stripe is [011]. Subsequently, wet etching with a mixture solution of hydro-bromic acid and phosphoric acid is conducted to form a ridge waveguide which has a (111) A surface as the side wall of the ridge and has a reversed mesa form in cross section.

Figure 3D:
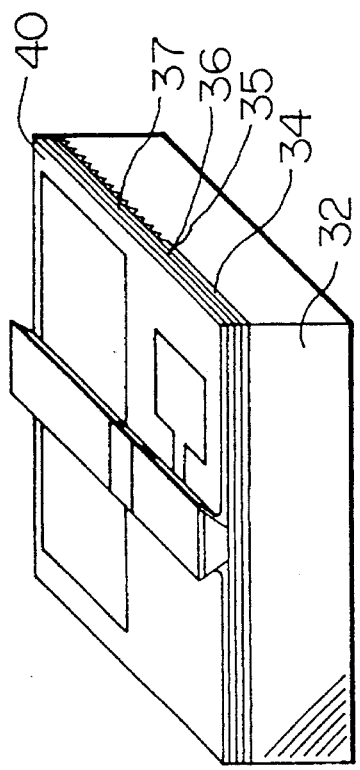

Next, a silicon oxide film 40 of 0.6 μm thickness is formed on the entire surface of the substrate by use of a known technique. Thereafter, an window 41 passing through the silicon oxide film is formed on the upper surface of the ridge by use of an etch-back method. After an electrode forming step, a device having a cavity length of 600 μm is cut through a cleavage process. A low-reflection film having a reflectivity of 0.1% and a high-reflection film having a reflectivity of 90% are formed on front and rear end faces of the device by use of known techniques, thereby fabricating an optical modulator integrated distributed feedback laser as shown in FIG. 3D.

The fabricated device exhibited a satisfactory oscillation characteristic including a threshold current of 15 to 20 mA and a slope efficiency of 0.20 W/A under a room temperature and continuous operating condition. Also, a modulation band of 20 GHz was obtained as the result of reflection of the narrowing of the ridge width. Further, as the result of light transmission at 10 Gb/s using the device of the present embodiment, there was confirmed a satisfactory transmission characteristic which is free of the deterioration of signal quality after transmission.

(Embodiment 3)

Figure 4:
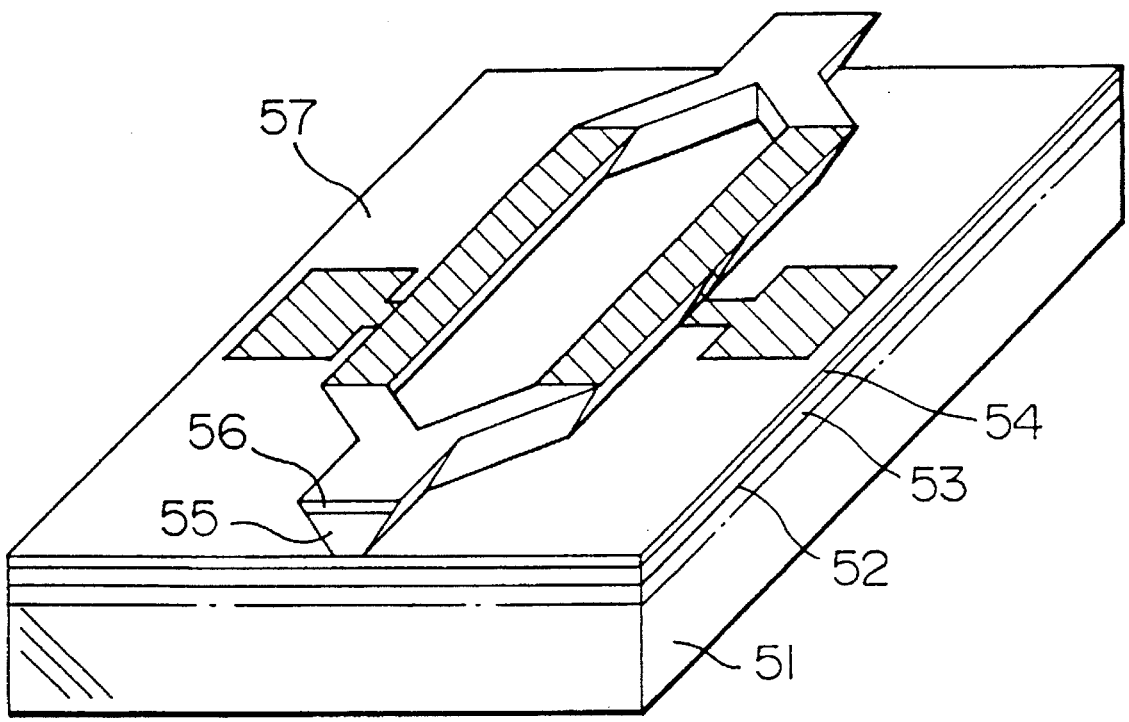
FIG. 4 is a perspective view showing still another embodiment of the waveguide device of the present invention.

Referring to FIG. 4, a lower light guiding layer 52 of n-type InGaAsP having a thickness of 0.05 μm (and a composition wavelength of 1.15 μm), a 20-period MQW structure 53 composed of a well layer of InGaAsP having a thickness of 9 nm (and a composition wavelength of 1.50 μm) and a barrier layer of InP having a thickness of 8 nm, an upper light guiding layer 54 of InGaAsP having a thickness of 0.05 μm (and a composition wavelength of 1.15 μm), a cladding layer 55 of p-type InP having a thickness of 2.0 μm and a cap layer 56 of p-type InGaAs having a thickness of 0.2 μm are formed on an n-type (100) InP substrate 51 by use of known techniques. Next, as shown in FIG. 4, the cap layer 56 is worked into a branch waveguide structure of 4.0 μm width by use of a known technique, in a manner similar to that in the Embodiment 1. The direction of the waveguide is [011]. Subsequently, wet etching with a mixture solution of hydro-bromic acid and phosphoric acid is conducted to form a ridge waveguide which has a (111) A surface as the side wall of the ridge and has a reversed mesa form in cross section.

Next, a silicon oxide film 57 of 0.6 μm thickness is formed on the entire surface of the substrate through a known technique. Thereafter, an window passing through the silicon oxide film is formed on the upper surface of the ridge by use of an etch-back method. After an electrode forming step, a device having a cavity length of 1.4 mm is cut through a cleavage process. A low-reflection film having a reflectivity of 1% is formed on each of opposite end faces of the device by use of a known technique, thereby fabricating an interference optical modulator.

The fabricated device exhibited a satisfactory modulation characteristic having an operating voltage of 3 V. The total loss of the device was small or 7 dB at the result of reflection of the smooth form of the side wall of the ridge. Also, a modulation band of 20 GHz was obtained as the result of reflection of the narrowing of the ridge width. Further, as the result of light transmission at 10 Gb/s using the device of the present embodiment, there was confirmed a satisfactory transmission characteristic which is free of the deterioration of signal quality after transmission.

(Embodiment 4)

Figure 5:
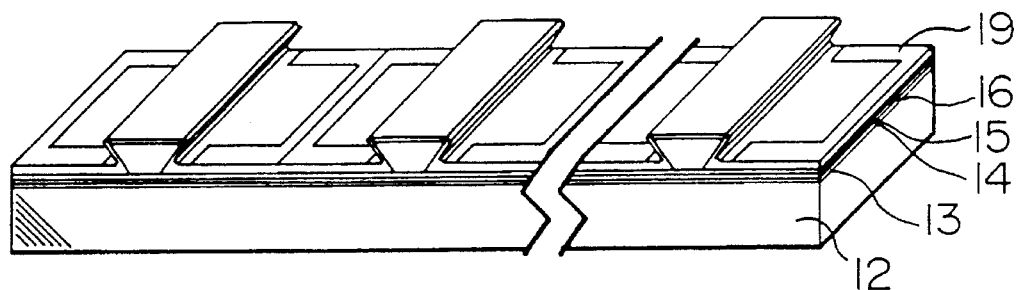
FIG. 5 is a perspective view showing a further embodiment of the waveguide device of the present invention.

FIG. 5 shows an embodiment in which a 10-channel laser array is fabricated on the same substrate in a manner substantially similar to that in the Embodiment 1. The active layer includes a strain MQW (multiple quantum well) structure 61 of InGaAsP with 1.3 μm thickness formed by use of a known technique. In order to reduce a threshold current, the width of the light emitting region and the cavity length are respectively selected to be 1 μm and 150 μm and high-reflection films having their reflectivities of 80% and 90% are respectively formed on opposite end faces of the device. An oscillation threshold current and a slope efficiency of the whole channel under a room temperature and continuous operating condition were 2 to 3 mA and 0.45 to 0.47 W/A, respectively. Using the fabricated device as a light source for optical wiring between computer boards, there was confirmed a satisfactory transmission characteristic in which light emission delay and transmission delay are reduced.

(Embodiment 5)

Figure 6:
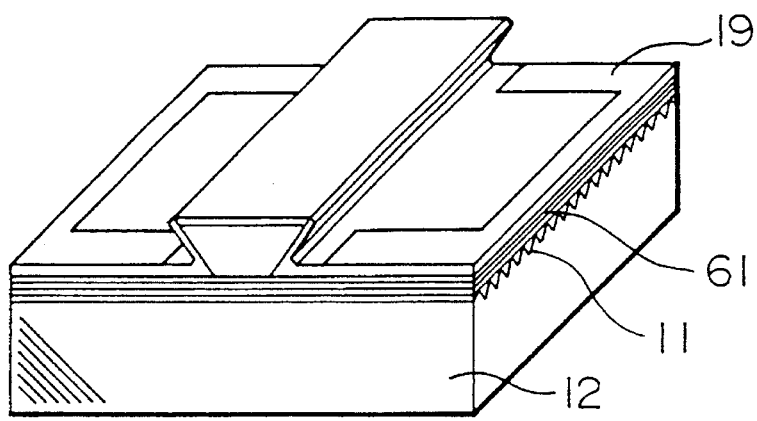
FIG. 6 is a perspective view showing a still further embodiment of the waveguide device of the present invention.

FIG. 6 shows an embodiment in which a distributed feedback laser capable of operating at high temperatures higher than 85° C. is fabricated in a manner substantially similar to that in the Embodiment 1. The active layer includes a strain MQW (multiple quantum well) structure 61 of InGaAsP with 1.3 μm thickness formed by use of a known technique. For the purpose of an increase in output and a satisfactory temperature characteristic, the width of the light emitting region and the cavity length are respectively selected to be 1.5 μm and 300 μm and low- and high-reflection films having their reflectivities of 1% and 90% are respectively formed on opposite end faces of the device. An oscillation threshold current and a slope efficiency under a room temperature and continuous operating condition were 5 to 8 mA and 0.40 to 0.43 W/A, respectively. Also, an oscillation threshold current and a slope efficiency under a 100° C. and continuous operating condition were 25 to 30 mA and 0.27 to 0.32 W/A, respectively. Using the fabricated device as a light source of a subscriber optical communication system, a satisfactory transmission characteristic was confirmed even at the time of operation at high temperatures.

(Embodiment 6)

Figure 7:
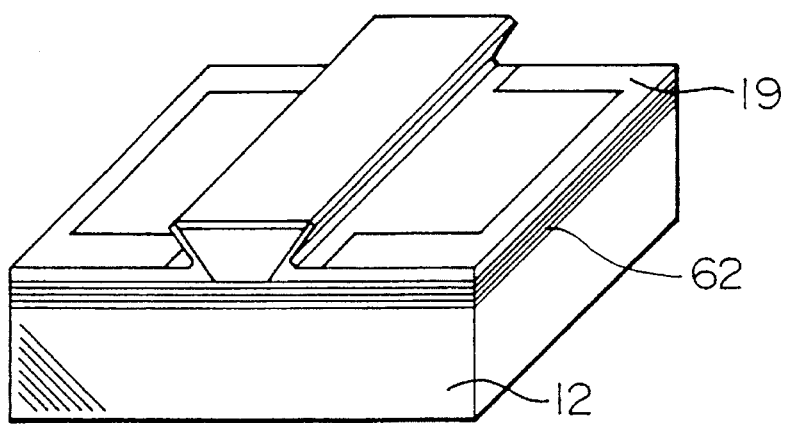
FIG. 7 is a perspective view showing a furthermore embodiment of the waveguide device of the present invention.

FIG. 7 shows an embodiment in which a high-output laser oscillating at 1.48 μm is fabricated in a manner substantially similar to that in the Embodiment 1. The active layer includes a strain MQW structure 62 of InGaAsP formed by use of a known technique. For the purpose of an increase in output and a satisfactory temperature characteristic, the width of the light emitting region and the cavity length are respectively selected to be 1.5 μm and 800 μm and low- and high-reflection films having their reflectivities of 5% and 90% are respectively formed on opposite end faces of the device. An oscillation threshold current and a slope efficiency under a room temperature and continuous operating condition were 25 to 32 mA and 0.40 to 0.43 W/A, respectively. Also, a maximum light output of 400 mW was obtained. Using the fabricated device as an excitation light source of an erbium-doped fiber amplifier, there was confirmed a satisfactory light amplification characteristic which has a low noise intensity.

(Embodiment 7)

Figure 8A:
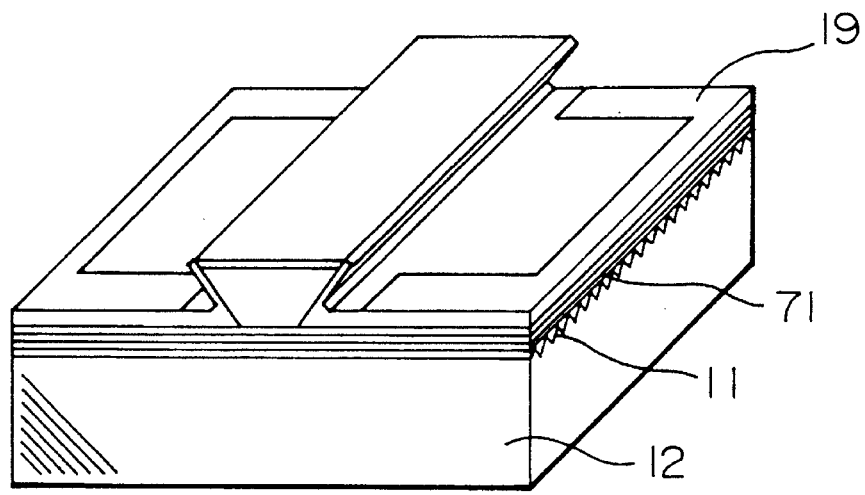
FIG. 8A is a perspective view showing a moreover embodiment of the waveguide device of the present invention.
Figure 8B:
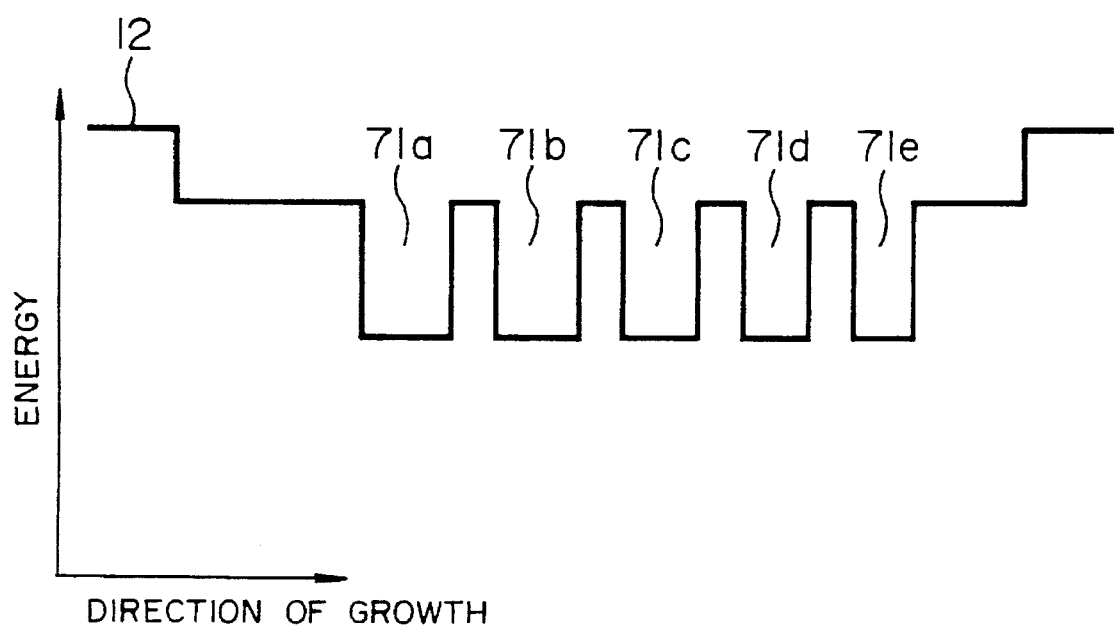
FIG. 8B is a graph showing the characteristic of the waveguide device shown in FIG. 8A.
Figure 9:
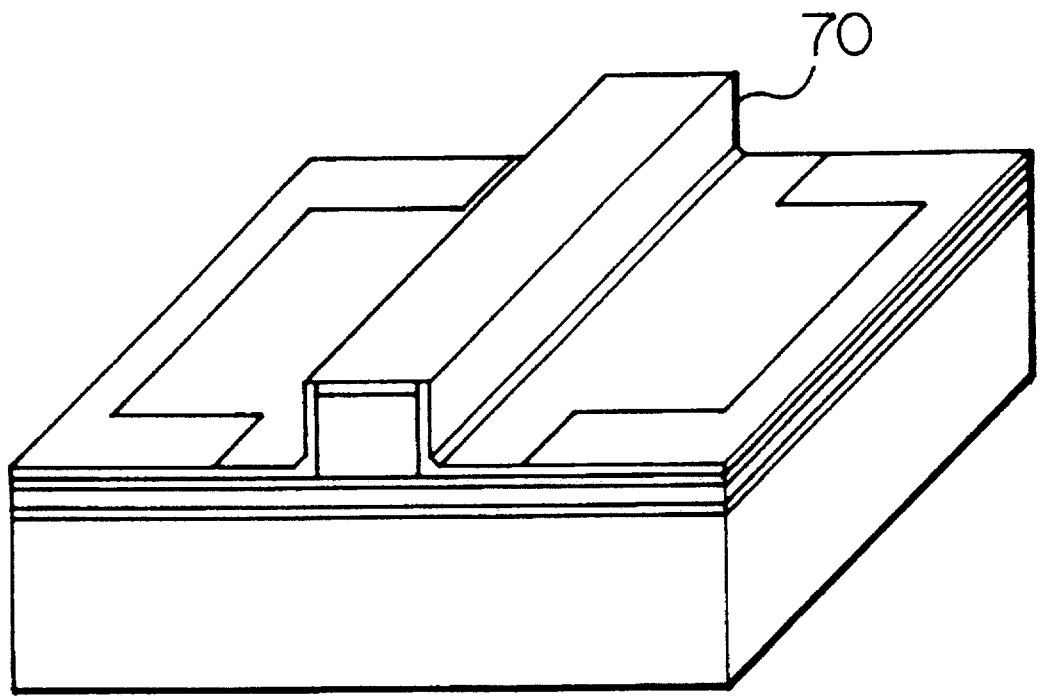
FIG. 9 is a view for explaining the prior art.

FIG. 8A shows the structure of a device in which the high-temperature operation characteristic of the distributed feedback laser of the Embodiment 5 is further improved in a similar manner. The active layer includes a plurality of well layers 71 of InGaAsP having a compressive strain of 1%. The thicknesses of the quantum well layers are modulated or are 6.0, 5.5, 5.0, 4.5 and 4.0 nm at an order from the n-type InP substrate 12 side. Each barrier layer has a fixed thickness of 7 nm. In this case, a difference in quantum level emission wavelength between the maximum thickness quantum well layer 71a and the minimum thickness quantum well layer 71e is 30 nm, as apparent referring to from FIG. 8B. The period of a diffraction grating 11 is adjusted so that a difference between an oscillating wavelength and a gain peak wavelength is −10 to +10 nm at the room temperature. The multi-layer wafer is worked into a ridge-waveguide laser structure similar to that in the Embodiment 5.

In the distributed feedback laser according to the present embodiment, a threshold current and a slope efficiency at an oscillating wavelength of 1.3 μm and at the room temperature were 6 to 12 mA and 0.45 to 0.60 W/A, respectively. A difference between the oscillating wavelength and a gain peak wavelength at the room temperature was in a range between −10 and +10 nm. Also, a device having a threshold current of 15 to 25 mA and a slope efficiency of 0.35 to 0.45 W/A at 85° C. was obtained at a high yield. Stable DFB oscillation was obtained even at −40° C. A side mode suppression ratio was equal to or larger than 35 in the whole temperature range. This great improvement of the temperature characteristic is caused by the leakage current suppression effect obtained by the reversed-mesa ridge waveguide structure as well as the effect of expansion of a high-gain wavelength region of the active layer obtained by the modulation of the well layer thickness.

According to a light emitting semiconductor device of the present invention, the device characteristic can be greatly improved in such a manner that the side wall of an indium phosphide ridge waveguide having a low operating current, a low operating voltage and an excellent high-speed characteristic is configured into a reversed mesa form to make the width of an electrode contact large and a light emitting region narrow. With the use of the present invention, not only the performance of the device and the yield are greatly improved but also it is possible to easily realize the increase in both the capacity and the transmission distance of an optical communication system to which the device of the present invention is applied.

We claim:

1. A waveguide device, including:

an indium phosphide ridge-waveguide formed above a substrate, wherein a side wall of said ridge-waveguide has a reversed mesa form.

2. A waveguide device according to claim 1, wherein the ridge is formed using a hydro-bromic acid solution or a mixture solution of hydro-bromic acid and phosphoric acid.

3. A waveguide device as claimed in claim 1, integrated on a substrate together with at least one of an indium phosphide laser, optical amplifier, optical modulator, optical switch and optical detector.

4. A waveguide device according to claim 1, wherein the side wall of said indium phosphide ridge-waveguide protrudes above said substrate without substantially contacting any other structures.

5. A waveguide device according to claim 1, wherein the side wall of said indium phosphide ridge-waveguide is contacted with insulating means.

6. A waveguide device including:

a substrate;

an indium gallium arsenic phosphide layer formed above said substrate;

a ridge shaped indium phosphide layer formed on said indium gallium arsenic phosphide layer; and an indium gallium arsenic layer formed on an upper surface of said ridge shaped indium phosphide layer, wherein the side wall of said ridge shaped indium phosphide layer has a reversed mesa form.

7. A waveguide device according to claim 6, further comprising a spacer layer provided between said indium gallium arsenic phosphide layer and said indium phosphide layer.

8. A waveguide device according to claim 7, further comprising an etching stopper layer provided between said indium phosphide layer and said spacer layer.

9. A waveguide device according to claim 6, wherein said indium phosphide ridge-waveguide protrudes above said substrate without substantially contacting any other structures.

10. A waveguide device according to claim 6, wherein the side wall of said indium phosphide ridge-waveguide is contacted with insulating means.

11. A waveguide device including a ridge-waveguide device formed on an indium phosphide substrate, wherein a side wall of said ridge includes a reversed mesa form; and wherein the side wall on each of opposite sides of said ridge includes a crystal surface of a (111) A surface.

12. A ridge-formed type indium phosphide distributed feedback semiconductor laser formed on a basis of a waveguide device, wherein a side wall of a ridge of the laser includes a reversed mesa form; wherein a light emitting layer of the laser has at least two quantum well layers; and wherein a quantum level emission wavelength of at least one of said quantum well layers is different from that of the other quantum well layer.

13. A waveguide device comprising:

an indium phosphide substrate including a diffraction grating;

an active layer formed on said indium phosphide substrate; and a cladding layer formed on said active layer in which said cladding layer includes a ridge structure, the side wall of which is configured into a reversed mesa form.

14. A waveguide device according to claim 13, wherein said active layer has an MQW structure including an alternate superposition of well layers and barrier layers.

15. A waveguide device according to claim 14, wherein a thickness of the well layers are successively made thin toward a cladding layer side from a substrate side.

* * * * *